United States Patent [19]

Fujimoto et al.

[11] Patent Number: 5,037,780
[45] Date of Patent: Aug. 6, 1991

[54] METHOD FOR ATTACHING SEMICONDUCTORS TO A TRANSPARENT SUBSTRATE USING A LIGHT-CURABLE RESIN

[75] Inventors: Hiroaki Fujimoto, Hirakata; Kenzou Hatada, Katano; Yoshinobu Takeshita; Kazuya Otani, both of Kagoshima; Koji Hidaka, Kushikino; Tsuguo Sakiyama, Kagoshima, all of Japan

[73] Assignee: Matsushita Electric Industrial, Co., Ltd., Osaka, Japan

[21] Appl. No.: 473,925

[22] Filed: Feb. 1, 1990

[30] Foreign Application Priority Data

Feb. 2, 1989 [JP] Japan ................... 1-24163

[51] Int. Cl.⁵ ............... H01L 21/84; H01L 21/56
[52] U.S. Cl. ...................... 437/212; 29/841; 29/740
[58] Field of Search ............ 437/212, 213, 926, 946, 437/205; 29/831, 832, 834, 836, 841, 740, 741, 743, 729; 174/52.4, 52.3, 52.1

[56] References Cited

U.S. PATENT DOCUMENTS

| | | | |
|---|---|---|---|
| 4,208,005 | 6/1980 | Nate et al. | 29/834 |
| 4,375,126 | 3/1983 | Düll et al. | 29/832 |
| 4,451,324 | 5/1984 | Ichikawa et al. | 29/832 |
| 4,749,120 | 6/1988 | Hatada . | |

FOREIGN PATENT DOCUMENTS

| | | | |
|---|---|---|---|
| 62-252946 | 11/1987 | Japan | 437/212 |
| 63-127541 | 5/1988 | Japan | 437/212 |
| 612331 | 1/1989 | Japan | 437/212 |
| 2151517A | 7/1985 | United Kingdom | 29/729 |

OTHER PUBLICATIONS

Fifth IEE/CHMT International Electronic Manufacturing Technology Symposium, "Design-to-Manufacturing Transfer Cycle", Lake Buena Vista, Fla., Oct. 10-12, 1988, pp. 23-27; K. Hatada et al., a New LSI Bonding Technology, Micron Bump Bonding Assembly Technology.
Patent Abstracts of Japan, vol. 12, No. 174 (E-612), May 24, 1988; & JP-A-62281360 (Matsushita Electric Ind. Co., Ltd.) Dec. 7, 1987.

*Primary Examiner*—Olik Chaudhuri
*Assistant Examiner*—David E. Graybill
*Attorney, Agent, or Firm*—Ratner & Prestia

[57] ABSTRACT

A method for fabricating semiconductor devices comprising pressing first and second semiconductor devices against a transparent board at different times by means of first and second pressure tools that are separate from each other and move upward and downward independent of each other so that a difference in thickness between the devices and a deflection of the devices can be absorbed and a reliable electrical connection between the electrodes of the devices and the conductors of the board can be attained, which makes it possible to continuously achieve a highly dense assembly of semiconductor devices with a minute gap therebetween.

8 Claims, 7 Drawing Sheets

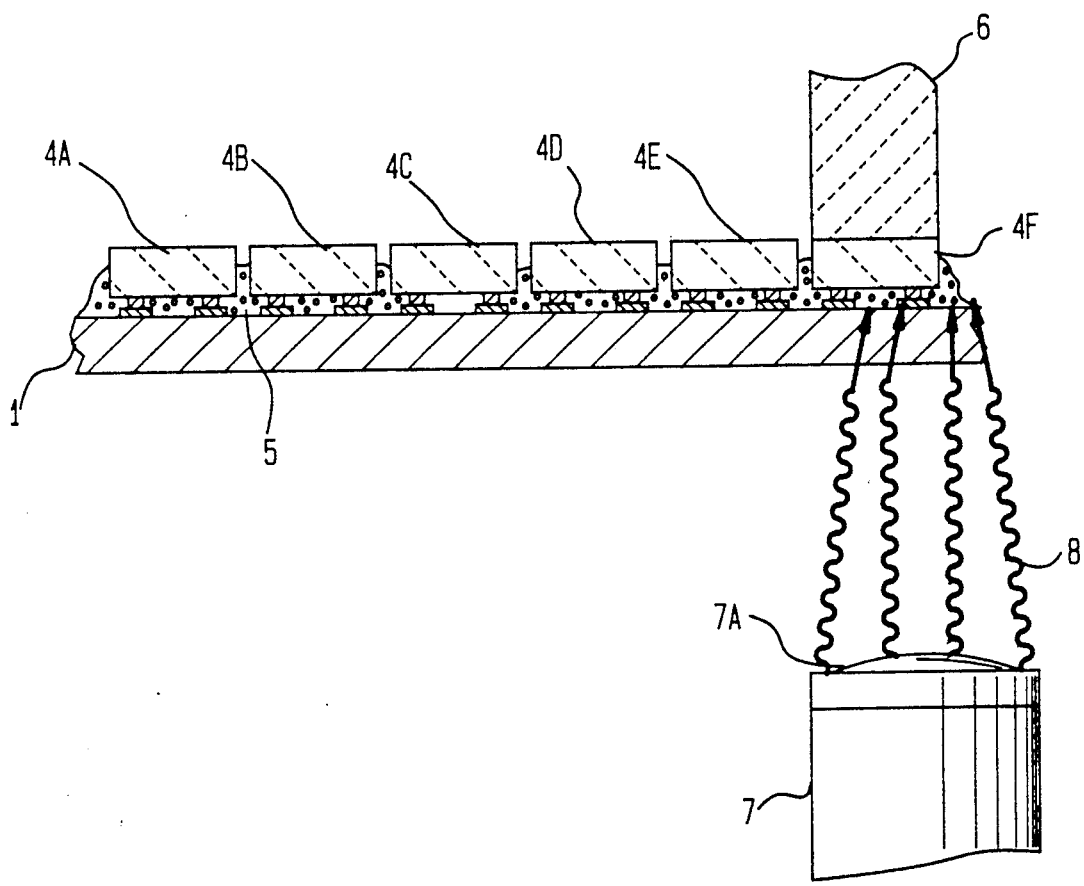

METHOD FOR ATTACHING SEMICONDUCTORS TO A TRANSPARENT SUBSTRATE USING A LIGHT-CURABLE RESIN

BACKGROUND OF THE INVENTION

1. Field of the Invention

The present invention relates to a method for fabricating semiconductor devices. More particularly it relates to a narrow gap continuous assembly method for semiconductor devices having bump electrodes.

2. Description of the prior art:

In recent years, a highly dense assembly of semiconductor integrated circuit devices has been increasingly needed. A method for assembling devices with a narrow gap therebetween by the use of a microbump bonding process has been proposed as a method by which the number of bonding pads for devices is increased, the pitch of the pads to be bonded is minimized, and a large number of semiconductor integrated circuit devices are assembled with a minute gap therebetween (Assembly of LED arrays by a microbump bonding process; Electronic Information, Institute of Communication, Joint Society for Integrated Circuit/VLSI Design Technical Research, VLD 88-70).

Such a process will be described below by reference to FIGS. 1a to 1c.

As shown in FIG. 1a, connecting resin 23 is applied onto a first-chip fixing region of the surface of a circuit board 21 of glass on which conductors 22A and 22B are disposed. The conductors each are made of Au, ITO, or the like and the connecting resin 23 is a light setting resin such as epoxy resin, acrylic resin, or the like. Then, as shown in FIG. 1b, a first semiconductor chip 24A having gold bump electrodes 25A is disposed on the circuit board 21 in such a way that the bump electrodes 25A face the conductors 22A, respectively. Next, a pressure tool 26, which can simultaneously press two semiconductor chips against the circuit board 21, is used to press the first semiconductor chip 24A toward the circuit board 21. A portion of the connecting resin 23 that is positioned on the conductor 22A moves to the periphery of the semiconductor chip 24A so as to be resin 23A, so that the bump electrodes 25A are electrically connected to the conductors 22A respectively. Next, the ultraviolet rays 28 emitted from an optical fiber 27 radiate about half of the first semiconductor chip 24A to cure about half (the left side of the dashed line 0) of the connecting resin 23, the radiated area of the ultraviolet rays 28 being controlled depending upon the size of a lens 27A at the utmost end of the optical fiber 27. The main wavelength of the ultraviolet rays 28 is 365 nm and the illuminance thereof is about 1000 to 2000 mW/cm². The pressure of the tool 26 is removed from the semiconductor chip 24A. The electrode 25A and the corresponding conductor 22A in the area where the resin 23 has been cured are electrically connected to each other.

Thereafter, as shown in FIG. 1c, light setting resin 23' that is the same as the light setting resin 23 is applied onto the circuit board 21 adjacent to the resin 23, and then a second semiconductor chip 24B is disposed on the board 21 in the same way as that of the chip 24A and pressed toward the board 21 by means of the pressure tool 26, the Chips 24A and 24B being spaced at a minute gap of about 5 to 20 μm. Next, the ultraviolet rays 28 are radiated from the optical fiber 27 onto an area of about half of the chip 24A, a portion of the resin 23 that has not yet been cured between the chips, and about half of the chip 24B so as to cure the resins 23 and 23'. Then, the pressure of the tool 26 is released. In this way, the entire area of the chip 24A and about half the area of the chip 24B are completely electrically connected to the circuit board 21; that is, the electrodes 25A of the chip 24A and conductors 22A of the board 21, respectively, and one of the electrodes 25B and about half of the chip 24B and the conductor 22B of the board 21 in the vicinity of the chip 24A are connected to each other. In this way the chip 24A is completely fixed to the board 21 as a whole.

The above-mentioned process is repeated, as desired, a plurality of times, and a large number of semiconductor chips can be mounted on the board each with a minute gap therebetween.

When the above-mentioned conventional process is used, the inventors of the present invention have found that the following problems are unexpectedly created because the two adjacent semiconductor chips are pressed by the same pressure tool 26.

(1) When the adjacent semiconductor chips 24A and 24B are different from each other in thickness, as shown in FIG. 2, the chip 24A with a thickness that is smaller than that of the chip 24B is not pressed, causing a defective connection.

(2) When the second semiconductor chip 24B is smaller in thickness than the first Chip 24A, the first chip 24A pressed before the second chip 24B is pressed, so that, as shown in FIG. 3, the connecting resin squeezed out from the periphery of the first chip 24A flows toward the second chip 24B, which causes the second chip 24B to shift from a given position to a position that is apart from that of the first chip 24A.

As mentioned above, when a large number of chips are tried to be assembled on a circuit board with a minute gap therebetween by the conventional microbump bonding process, the above-mentioned problems are created, which leads to a defective assembly.

SUMMARY OF THE INVENTION

The method for fabricating semiconductor devices of this invention, which overcomes the above-discussed and numerous other disadvantages and deficiencies of the prior art, comprises: applying a first insulation light-setting resin to a portion of one main face of a transparent board with conductors onto which a first semiconductor device is to be fixed; disposing said first semiconductor device on said portion of the board to which said first insulation resin has been applied in such a way that electrodes of said first semiconductor device coincide with a conductor group of the board; pressing said first semiconductor device against said board by means of a first pressure tool; selectively irradiating with light rays a portion of said first insulating resin that is positioned at a portion of said first semiconductor device including the electrode at one outer side but excluding the electrode at the other outer side, said irradiation with light rays being carried out from the other main face of said board, so that said portion of said first insulation resin is hardened; applying a second insulation light-setting resin to a portion of said one main face of the board that is adjacent to said first semiconductor device; disposing a second semiconductor device on said portion of the board to which said second insulation resin has been applied in such a way that electrodes of said second semiconductor device coincide with another conductor group of the board; pressing said first and second semiconductor devices against the board by means of said first pressure tool and a second pressure tool, which is separate from said first pressure tool and moves upward and downward independent of said first pressure tool, respectively; and selectively irradiating with light rays the remaining portion of said first insulation resin, the insulation resin positioned between said first and second semiconductor devices, and a portion of said second insulation resin that is positioned at a portion of said second semiconductor device including the electrode at the first semiconductor device side, but excluding the electrode at the other side of said second semiconductor device, said irradiation with light rays being carried out from the other main face of the board, and a portion of the area irradiated with light rays in this step overlapping a portion of the area irradiated with light rays in the previous step, so that the remaining portion of said first insulation resin, the insulation resin positioned between said first and second semiconductor devices, and the portion of said second insulation resin positioned at a portion of said second semiconductor device except for an area including the electrode that is further from said first semiconductor device.

Alternatively, the method for fabricating semiconductor devices of this invention comprises: applying a first insulation resin to the surface of a first semiconductor device on which electrodes are disposed: disposing said first semiconductor device on one main face of a transparent substrate on which conductors are disposed so that said electrodes of said first semiconductor device coincide with said conductors of the board; pressing said first semiconductor device against said board by means of a first pressure tool; selectively irradiating with light rays a portion of said first insulation resin that is positioned at a portion of said first semiconductor device including an area at one outer side, but excluding an area of the electrode at the other outer side, said irradiation with light rays being carried out from the other main face of said board, so that said portion of said first insulation resin is hardened; applying a second insulation resin to the surface of a second semiconductor device on which electrodes are disposed; disposing said second semiconductor device on a portion of said one main face of the board that is adjacent to said first semiconductor device in such a way that said electrodes of said second semiconductor device coincide with a conductor group of said board; pressing said first and second semiconductor devices against the board by means of said first pressure tool and a second pressure tool, which is separate from said first pressure tool and moves upward and downward independent of said first pressure tool, respectively; and selectively irradiating with light rays the remaining portion of said first insulation resin, the insulation resin positioned between said first and second semiconductor devices, and a portion of said second insulation resin that is positioned at a portion of said second semiconductor device including the electrode on the first semiconductor device side, but excluding the electrode on the other side of said second semiconductor device, said irradiation with light rays being carried out from the other main face of the board, and a portion of the area irradiated with light rays in this step overlapping a portion of the area irradiated with light rays in the previous step, so that the remaining portion of said first insulation resin, the insulation resin positioned between said first and second semiconductor devices, and the portion of said second insulation resin positioned at a portion of said second semiconductor device except for an area including the electrode that is further from said first semiconductor device.

In a preferred embodiment, a sheet that is inferior in adhesion to said insulation resin is interposed between said pressure tools and said semiconductor devices.

In a preferred embodiment, the time when said first semiconductor device is pressed against said board by said first pressure tool is different from the time when said second semiconductor device is pressed against said board by said second pressure tool.

In a preferred embodiment, the electrodes of each of said first and second semiconductor devices are bump electrodes.

Thus, the invention described herein makes possible the objectives of (1) providing a method for fabricating semiconductor devices by which a gap between the adjacent chips when a large number of semiconductor chips are assembled on a circuit board can be minimized and a highly dense assembly of chips can be reliably attained; (2) providing a method for fabricating semiconductor devices by which the bump electrodes of each chip can be reliably and uniformly connected to the electrodes of the board; and (3) providing a method for fabricating semiconductor devices by which the semiconductor chips can be reliably fixed to the board and the electrodes of each chip can be reliably connected to the corresponding electrodes of the board without the shift of the chips from given positions on the board.

DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1A:
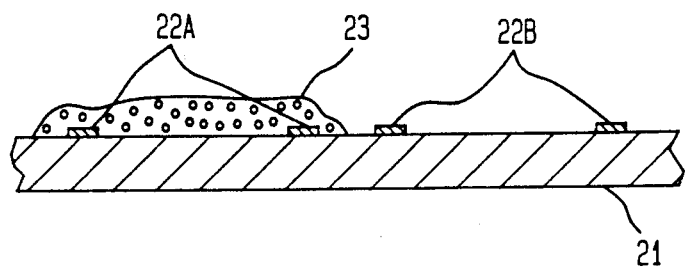
FIGS. 1a-1c, 2, and 3, respectively, are schematic diagrams showing conventional methods for fabricating semiconductor devices.
Figure 1B:
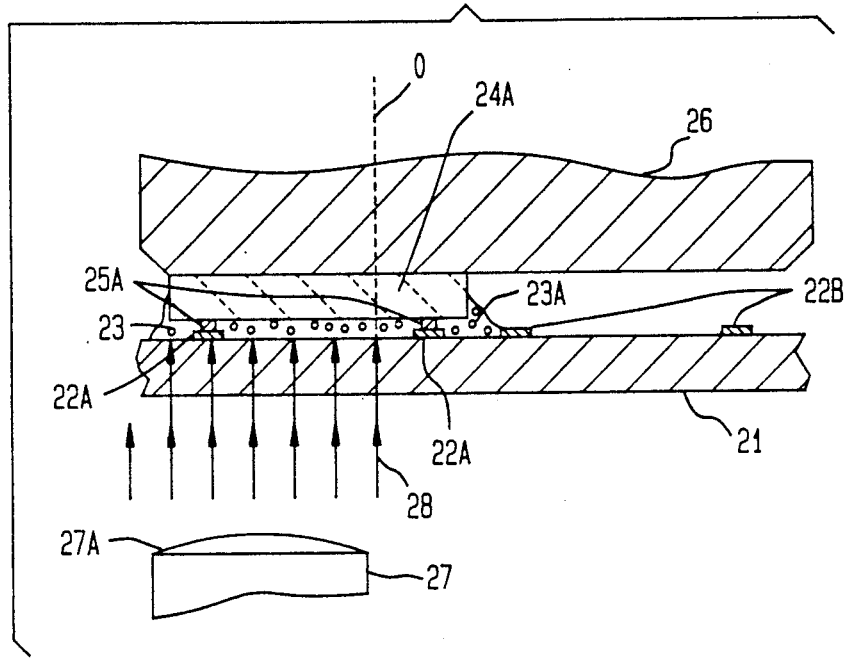
Figure 1C:
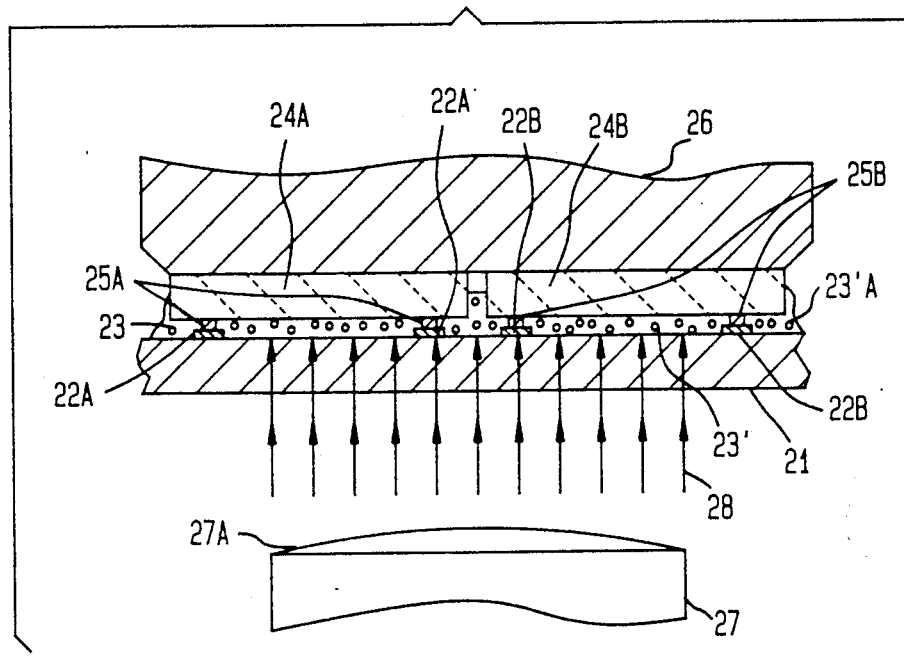
Figure 2:
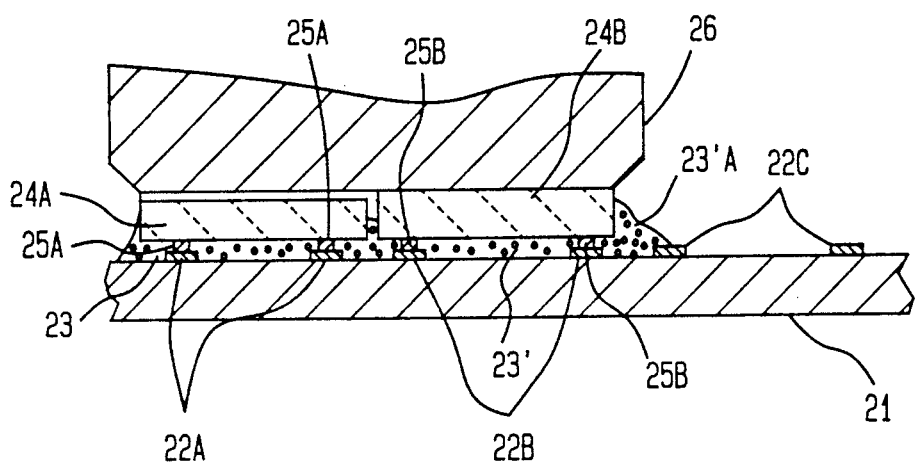
Figure 3:
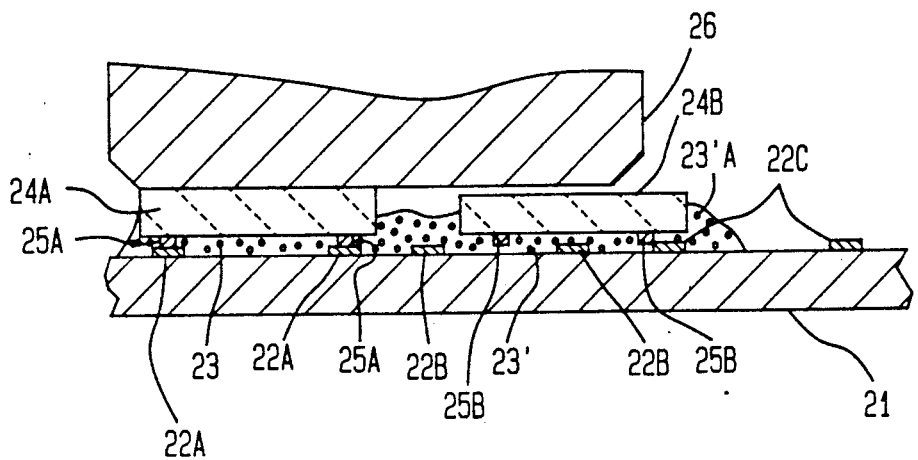
Figure 4A:
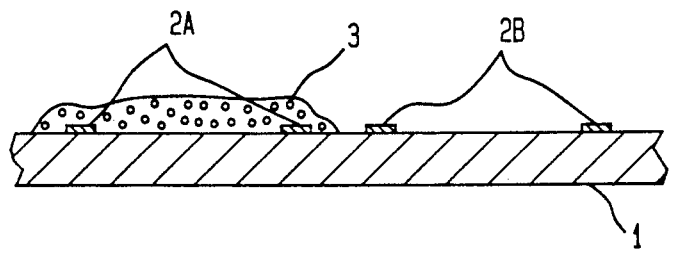
FIGS. 4a-4c and 5a-te, respectively, are schematic diagrams showing the method for fabricating semiconductor devices of this invention.
Figure 4B:
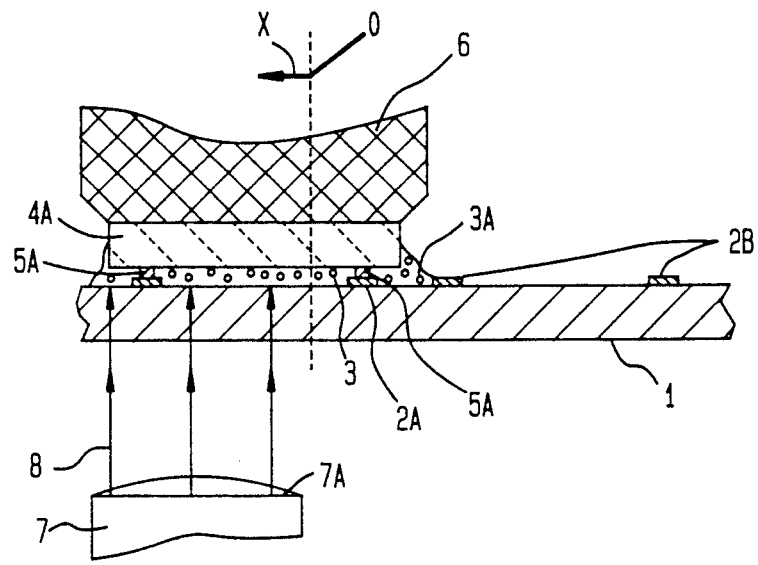
Figure 4C:
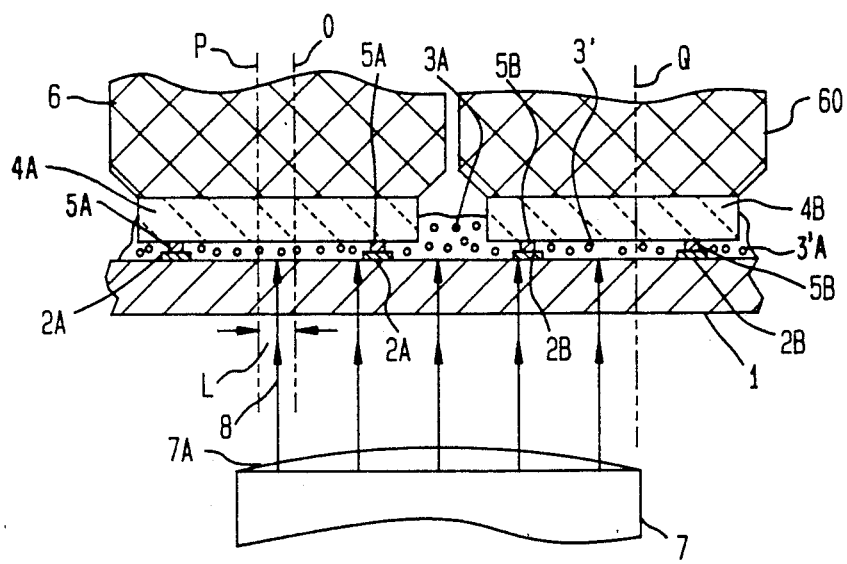

FIGS. 4a-4c show a method for fabricating semiconductor devices of this invention, by which, as shown in FIG. 4a, an insulating connecting resin 3 is applied onto a first semiconductor chip fixing-area of a main face of a transparent glass circuit board 1 that has conductors 2A and 2B thereon, the conductors 2A and 2B being made of Au, ITO, or the like, and the connecting resin 3 being a light setting resin such as epoxy resin, acrylic resin, or modified acrylic resin. Next, as shown in FIG. 4b, a first semiconductor chip 4A having Au bump electrodes 5A at positions corresponding to the position of the resin 3 is disposed on the circuit board 1 in such a way that the electrodes 5A and the corresponding conductors 2A, respectively, coincide with each other. Next, the first chip 4A is pressed toward the board 1 by means of a pressure tool 6 capable of pressing one semiconductor chip alone. The resin 3 positioned on the conductors 2A moves to the periphery of the chip 4A and becomes resin 3A, and the bump electrodes 5A comes into electrical contact with the conductors 2A, respectively. Next, the ultraviolet rays 8 emitted from an optical fiber 7 is selectively radiated from the other face of the board 1 to about half the area of the first semiconductor chip 4A from the outer side of the chip 4A, so that about half of the connecting resin 3 is cured. That is, a portion of the resin 3 at the left side of the line 0 (i.e., the X-mark area) shown in FIG. 4b is cured. The area X that is irradiated with ultraviolet rays 8 is controlled by the size of a lens 7A at the utmost end of the optical fiber 7. The main wavelength of the ultraviolet rays 8 is, for example, 365 nm, and the illuminance thereof is, for example, from about 1000 to 2000 mW/cm².

Then, the pressure against the chip 4A by means of the tool 6 is released. The bump electrodes 5A are electrically connected to the conductors 2A in the area where the connecting resin 3 of the first semiconductor chip 4A has been hardened. Next, as shown in FIG. 4c, a resin 3' that is the same as the resin 3 is applied onto the board 1 adjacent to the resin 3 at the unhardened side of the first semiconductor Chip 4A. Then, a second semiconductor chip 4B is disposed on the portion of the board 1 coated with the resin 3' in such a way that the bump electrodes 5B coincide with the conductors 2B. Then, the chip 4A is pressed by the tool 6 and the second semiconductor chip 4B is also pressed by a tool 60 that is independent of the tool 6 and capable of pressing one chip alone toward the board 1 the movement of the tools 6 and 60 in the vertical direction being independently Controlled. It is preferable that the tool 60 is lowered to press the chip 4B before the tool 6 is lowered. The gap between the first and second semiconductor chips 4A and 4B is as small as 5 to 20 μm.

Next, areas including the unhardened half of the first semiconductor chip 4A, a portion of the resin positioned between the chips 4A and 4B, and about half the area of the second semiconductor chip 4B at the chip 4A side are irradiated with the ultraviolet rays 8 by means of the optical fiber 7, so that a portion of the connecting resin 3 that has not yet been hardened and a portion of the connecting resin 3' at the chip 4A side are hardened. At this time, the light rays are radiated to an area indicated by mark L in FIG. 4c where the resin 3 has been hardened. That is, the area ranging from lines P to Q is irradiated with the light rays 8 Then, the pressure to each chip is released. In this way, the electrodes 5A of the first semiconductor chip 4A are electrically connected to the conductors 2A, respectively, and the electrode 5B in about half the area of the second semiconductor chip 4B is electrically connected to one of the conductors 2B. A portion of the resin 3' in the other half area of the chip 4B and a portion of the resin 3'A that has been squeezed out from the underneath of the chip 4B remain unharden.

The above-mentioned process is repeated a plurality of times and, as demanded, a large number of semiconductor chips are connected with a minute gap therebetween.

After the two aligned adjacent semiconductor devices are fixed to the board 1 by the use of the separate pressure tools that are lowered at a different time, the adjacent portions of semiconductor devices are irradiated with light rays, the process of which will be described in detail by reference to FIGS. 5a-5d. According to this process, the thickness and deflection of each semiconductor device are absorbed and the effect of resin on the adjacent semiconductor devices is eliminated, so that the semiconductor devices can be assembled with a minute gap therebetween and the complete electrical connection can be achieved between each device and the board.

Figure 5A:
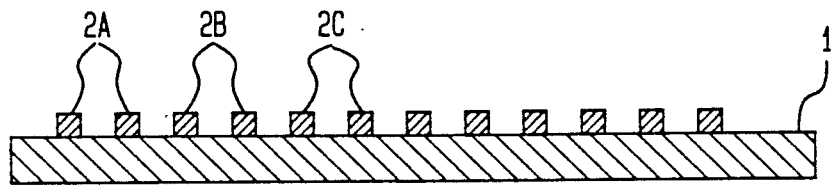
Figure 5B:
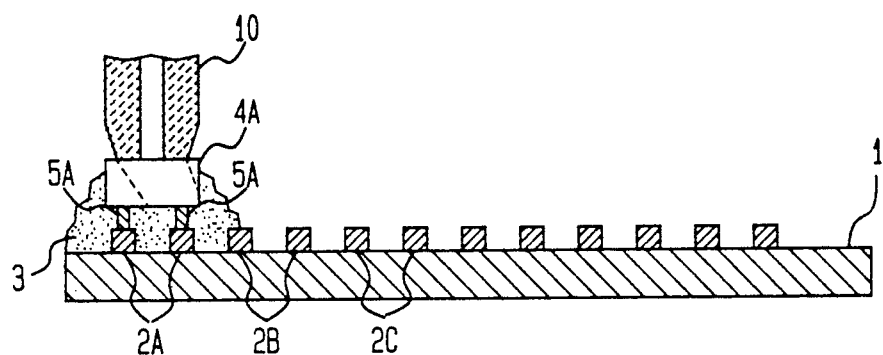

A circuit board 1 of FIG. 5a is made of glass, such as soda glass or corning 7059 glass and has a thickness of about 0.5 to 1 mm. Conductors 2A, 2B, 2C ... are made of Cu, AgPd, or the like and have each a thickness of about 0.1 to 50 μm. As shown in FIG. 5b onto the surface of a semiconductor device (chip) 4A that is provided with the bumps 5A, an ultraviolet ray setting resin 3 is applied by a stamping process. The semiconductor device 4A with gold bumps 5A is held by a vacuum collet 10 and moved close to the conductors of the circuit board in such a way that the device 4A does not come into contact with the conductors and the gold bumps 5A coincide with the conductors 2A, respectively. In other words, in the embodiment in FIGS. 5a-5d, the ultraviolet ray setting resin is applied onto the semiconductor device and the device is disposed on the circuit board 1 in such a way that the resin faces the board 1. The ultraviolet ray setting resin 3 is epoxy resins, silicone resins, acrylic resins, or the like, the gold bump 5A being about 10 to 50 μm in diameter and about 1 to 20 μm in thickness, the vacuum collet 10 being made of stainless steel, hard metal, sintered hard alloys, or the like.

Figure 6A:
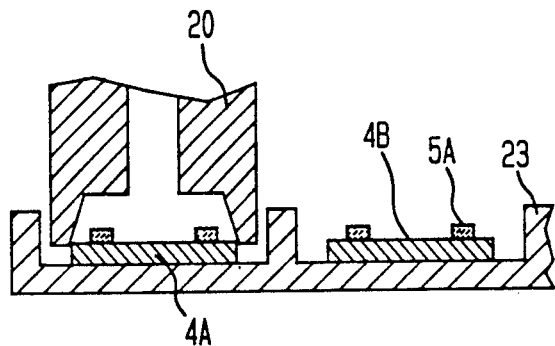
FIGS. 6a-6d are schematic diagrams showing a stamping process by which a ultraviolet ray setting resin is applied to a semiconductor device.
Figure 6B:
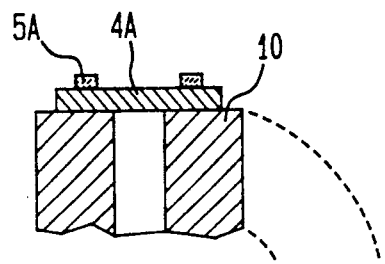
Figure 6C:
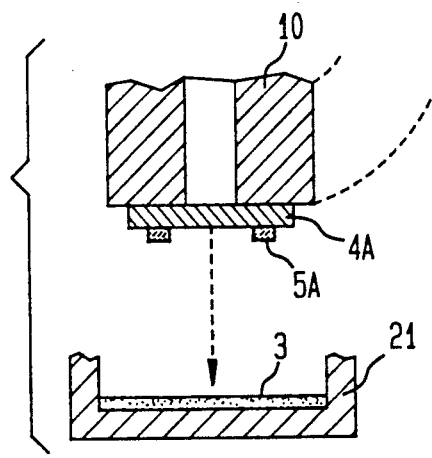
Figure 6D:
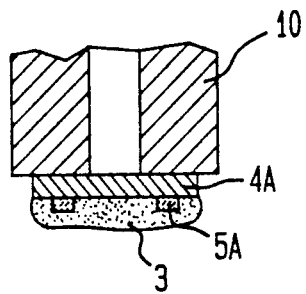

FIGS. 6a-6d show a stamping process by which the ultraviolet ray setting resin 3 is applied onto the semiconductor device 4A. As shown in FIG. 6a, first, the semiconductor device 4A disposed at a chip tray 23 is held by an input collet 20, and disposed on a vacuum collet 10. Next, as shown in FIGS. 6b and 6c, the vacuum collet 10 is turned upside down and then, as shown in FIG. 6d, it is lowered to the ultraviolet setting resin 3 disposed on a resin feed unit 21, after which, as shown in FIG. 6d, the ultraviolet ray setting resin 3 is applied onto the semiconductor device 4A.

Figure 5C:
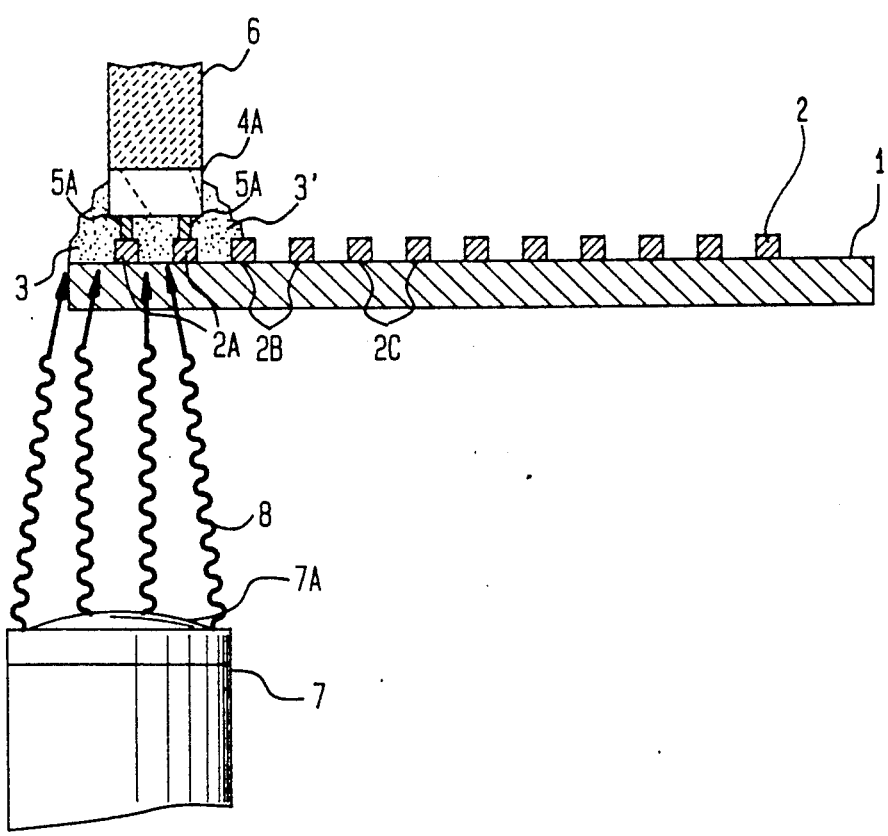

Next, as shown in FIG. 5c, the vacuum collet 10 is lowered so as to bring the gold bumps 5A into contact with the conductors 2A. Then, the vacuum collet 10 is removed and the pressure tool 6 instead is lowered so as to uniformly press the semiconductor device 4A. At this time, a portion of the ultraviolet ray setting resin 3 positioned on the conductors 2A is squeezed out therefrom, and the gold bumps 5A of the semiconductor device 4A is electrically connected to the conductors 2A, respectively. The pressure tool 6 is made of sintered hard alloys, ceramics, or the like and has a flatness of the pressure surface of 0.5 μm or less. In a state that the chip 4A is being pressed by the tool 6, about half area of the semiconductor device 4A is irradiated with the ultraviolet rays 8 from underneath the glass base so as to harden the ultraviolet ray setting resin 3 that has been applied onto the semiconductor device 4A, the region irradiated with the ultraviolet rays 8 being controlled by controlling the spot diameter of the fiber 7 or by a masking technique, and the ultraviolet rays 8 having a wavelength of 365 nm and an output of about 1000 mW.

Figure 5D:
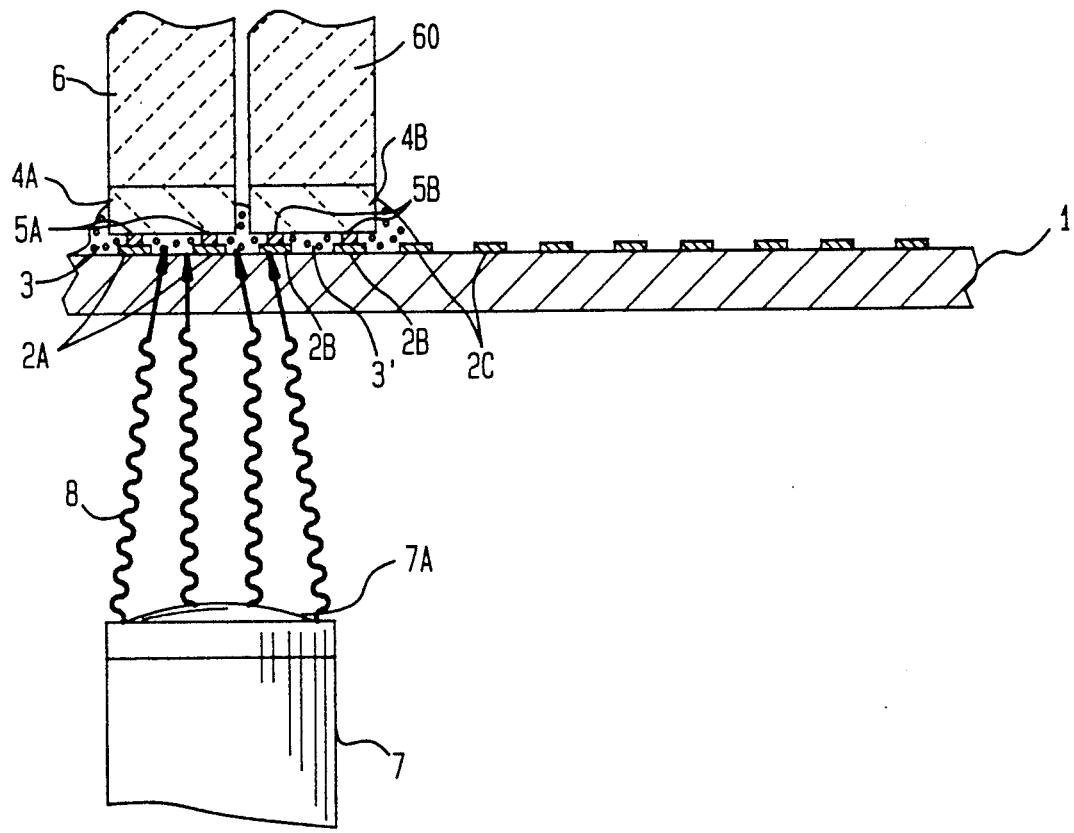

Then, as shown in FIG. 5d, the vacuum collet 10 is lowered and the semiconductor device (chip) 4B onto which a ultraviolet ray setting resin 3' has been applied is positioned adjacent to the semiconductor device 4A, which has been positioned and about half area of which has been fixed to the board 1, so that the gold bumps 5B coincide with the conductors 2B, respectively. The vacuum collet is then removed.

Then, so that differences in thickness and deflection between the semiconductor device 4A, which has been aligned and about half area of which has been fixed to the board 1, and the semiconductor device 4B, which has just positioned, can be absorbed, the semiconductors 4A and 4B are pressed by separate pressure tools 6 and 60, respectively. To prevent the semiconductor devices from shifting from a given position, the pressure tool 60 for pressing the semiconductor device 4B is lowered, first, and after the lapse of time of 1 to 2 seconds, the pressure tool 6 for pressing the semiconductor device 4A is lowered. Then, about the other half area of the semiconductor device 4A and about half of the semiconductor device 4B that is adjacent to the semiconductor device 4A are simultaneously irradiated with the ultraviolet rays 8. The above-mentioned process is repeated a plurality of times as desired, thereby attaining a continuous assembly of semiconductor devices with a minute gap therebetween.

In the embodiment of this invention, it is preferable that, in order to prevent the light setting resin from passing between the devices 4A and 4B and from being positioned on the devices 4A and 4B, a Teflon sheet that is inferior in adhesion to the light setting resin is interposed between the tools and the devices.

The resin tends to rise in the gap between the devices with a decrease in the size of the gap, and accordingly, the use of such a sheet becomes remarkably advantageous when the size of the gap is set to be small.

According to the process of FIGS. 5a–5d, a printer head with light emitting diodes (LEDs) was manufactured for trial, in which devices 4A and 4B are LED array chips of a light emitting dot pitch of 63.5 $\mu$m. The LED printer head was manufactured under the following conditions: The board size is A4; the number of LED array chips is 54 pcs/board, and the gap between the LED array chips is 10 $\mu$m. An LED array head having the above-mentioned construction was manufactured with a yield of 99.8%, whereas the production yield of an LED array head manufactured by a conventional process was in the range of 50 to 60%.

This invention attains the following excellent effects:

(1) Since separate tools individually are used to press the respective semiconductor Chips against the circuit board, the bumps of each chip are uniformly pressed so that a difference in thickness or deflection between the adjacent chips can be absorbed thereby attaining a reliable electrical connection;

(2) One half area of a semiconductor chip is irradiated with ultraviolet rays, first, and then the other half area thereof is irradiated with the rays, so that the ultraviolet ray setting resin squeezed out from the underneath of the semiconductor chip to the periphery of the semiconductor chip is not hardened, which makes it possible to continuously carry out a highly-dense assembly of semiconductor chips with a narrow space or gap (10 $\mu$m or less) therebetween;

(3) Defective semiconductor chips can be easily removed or exchanged; and (4) When the highly-dense assembly of this invention is applied to an LED array head for printers, an image sensor, a line light source, or the like, they are fabricated at a low cost, and miniaturized in comparison with those fabricated by a conventional wire bonding process. Moreover, these products are lightweight.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for fabricating semiconductor devices comprising:

applying a first insulation light-setting resin to a portion of one main face of a transparent board with conductors onto which a first semiconductor device is to be fixed;

disposing said first semiconductor device on said portion of the board to which said first insulation resin has been applied in such a way that electrodes of said first semiconductor device coincide with a conductor group of the board;

pressing said first semiconductor device against said board by means of a first pressure tool;

selectively irradiating with light rays a portion of said first insulating resin that is positioned at a portion of said first semiconductor device including the electrode at one outer side but excluding the electrode at the other outer side, said irradiation with light rays being carried out from the other main face of said board, so that said portion of said first insulation resin is hardened;

applying a second insulation light-setting resin to a portion of said one main face of the board that is adjacent to said first semiconductor device;

disposing a second semiconductor device on said portion of the board to which said second insulation resin has been applied in such a way that electrodes of said second semiconductor device coincide with another conductor group of the board;

pressing said first and second semiconductor devices against the board by means of said first pressure tool and a second pressure tool, which is separate from said first pressure tool and moves upward and downward independent of said first pressure tool, respectively; and selectively irradiating with light rays the remaining portion of said first insulation resin, the insulation resin positioned between said first and second semiconductor devices, and a portion of said second insulation resin that is positioned at a portion of said second semiconductor device including the electrode at the first semiconductor device side, but excluding the electrode at the other side of said second semiconductor device, said irradiation with light rays being carried out from the other main face of said board, and a portion of the area irradiated with light rays in this step overlapping a portion of the area irradiated with light rays in the previous step, so that the remaining portion of said first insulation resin, the insulation resin positioned between said first and second semiconductor devices, and the portion of said second insulation resin positioned at a portion of said second semiconductor device except for an area including the electrode that is further from said first semiconductor device.

2. A method for fabricating semiconductor devices according to claim 1, wherein a sheet that is inferior in adhesion to said insulation resin is interposed between said pressure tools and said semiconductor devices.

3. A method for fabricating semiconductor devices according to claim 1, wherein the time when said first semiconductor device is pressed against said board by said first pressure tool is different from the time when said second semiconductor device is pressed against said board by said second pressure tool.

4. A method for fabricating semiconductor devices according to claim 1, wherein said electrodes of each of said first and second semiconductor devices are bump electrodes.

5. A method for fabricating semiconductor devices comprising:

applying a first insulation resin to the surface of a first semiconductor device on which electrodes are disposed;

disposing said first semiconductor device on one main face of a transparent substrate on which conductors are disposed so that said electrodes of said first semiconductor device coincide with said conductors of the board;

pressing said first semiconductor device against said board by means of a first pressure tool;

selectively irradiating with light rays a portion of said first insulation resin that is positioned at a portion of said first semiconductor device including an area at one outer side, but excluding an area of the electrode at the other outer side, said irradiation with light rays being carried out from the other main face of said board, so that said portion of said first insulation resin is hardened;

applying a second insulation resin to the surface of a second semiconductor device on which electrodes are disposed;

disposing said second semiconductor device on a portion of said one main face of the board that is adjacent to said first semiconductor device in such a way that said electrodes of said second semiconductor device coincide with a conductor group of said board;

pressing said first and second semiconductor devices against the board by means of said first pressure tool and a second pressure tool, which is separate from said first pressure tool and moves upward and downward independent of said first pressure tool, respectively; and selectively irradiating with light rays the remaining portion of said first insulation resin, the insulation resin positioned between said first and second semiconductor devices, and a portion of said second insulation resin that is positioned at a portion of said second semiconductor device including the electrode on the first semiconductor device side, but excluding the electrode on the other side of said second semiconductor device, said irradiation with light rays being carried out from the other main face of the board, and a portion of the area irradiated with light rays in this step overlapping a portion of the area irradiated with light rays in the previous step, so that the remaining portion of said first insulation resin, the insulation resin positioned between said first and second semiconductor devices, and the portion of said second insulation resin positioned at a portion of said second semiconductor device except for an area including the electrode that is further from said first semiconductor device.

6. A method for fabricating semiconductor devices according to claim 5, wherein a sheet that is inferior in adhesion to said insulation resin is interposed between said pressure tools and said semiconductor devices.

7. A method for fabricating semiconductor devices according to claim 5, wherein the time when said first semiconductor device is pressed against said board by said first pressure tool is different from the time when said second semiconductor device is pressed against said board by said second pressure tool.

8. A method for fabricating semiconductor devices according to claim 5, wherein said electrodes of each of said first and second semiconductor devices are bump electrodes.

* * * * *

UNITED STATES PATENT AND TRADEMARK OFFICE
CERTIFICATE OF CORRECTION

PATENT NO. : 5,037,780

DATED : August 6, 1991

INVENTOR(S) : Fujimoto et al.

It is certified that error appears in the above-identified patent and that said Letters Patent is hereby corrected as shown below:

Column 4, line 40, "5a-te" should be --5a-5e--.

Signed and Sealed this

Sixth Day of October, 1992

Attest:

DOUGLAS B. COMER

Attesting Officer

Acting Commissioner of Patents and Trademarks